United States Patent [19]
Linder et al.

[11] Patent Number: 5,315,231
[45] Date of Patent: May 24, 1994

[54] SYMMETRICAL BIPOLAR BIAS CURRENT SOURCE WITH HIGH POWER SUPPLY REJECTION RATIO (PSRR)

[75] Inventors: Lloyd F. Linder, Agora Hills; Dwight D. Birdsall, Norwalk; Kelvin T. Tran, Carson, all of Calif.

[73] Assignee: Hughes Aircraft Company, Los Angeles, Calif.

[21] Appl. No.: 976,760

[22] Filed: Nov. 16, 1992

[51] Int. Cl.$^5$ .............................. G05F 3/26
[52] U.S. Cl. .................... 323/315; 323/313; 323/316; 307/296.1; 307/296.6
[58] Field of Search ............ 323/312, 313, 314, 315, 323/316; 330/252, 255, 258; 307/296.1, 296.5, 296.6, 296.7, 296.8

[56] References Cited

U.S. PATENT DOCUMENTS

| | | | |
|---|---|---|---|
| 4,595,883 | 6/1986 | Nakayama | 330/255 |
| 4,933,644 | 6/1990 | Fattaruso et al. | 330/258 |
| 4,970,470 | 11/1990 | Gosser | 330/252 |
| 5,223,743 | 6/1993 | Nakagawara | 307/296.1 |

Primary Examiner—Emanuel T. Voeltz
Assistant Examiner—Adolf Berhane
Attorney, Agent, or Firm—Georgann S. Grunebach; Terje Gudmestad; W. K. Denson-Low

[57] ABSTRACT

A bandgap reference voltage source (104) has positive and negative terminals (104a, 104b) which are connected through high impedance constant current sources (124c, 126c) to positive and negative voltage supplies (+VDD, −VEE) respectively. The effect of variations of the voltage supplies (+VDD, −VEE) on the voltage source (104) is low due to the high impedances of the currents sources (124c, 126c), providing a high power supply rejection ratio (PSRR). The reference voltage (VREF) generated by the voltage source (104) is converted into a reference current (IREF) which flows through two equal series resistors (108,110), and also through current mirrors (124,126) which produce positive and negative output currents corresponding thereto. The current sources (124c, 126c) for the voltage source (104) are also controlled by the current mirrors (124,126). A servo control amplifier (232) senses the voltage at the junction (234) of the resistors (108,110) and adjusts the voltage at either the positive or negative terminal (104a, 104b) of the voltage source (104) to maintain the voltages at the terminals (104a, 104b) symmetrical with respect to ground, thereby preventing the voltage source (104) from latching to one of the voltage supplies (+VDD, −VEE) during startup.

14 Claims, 4 Drawing Sheets

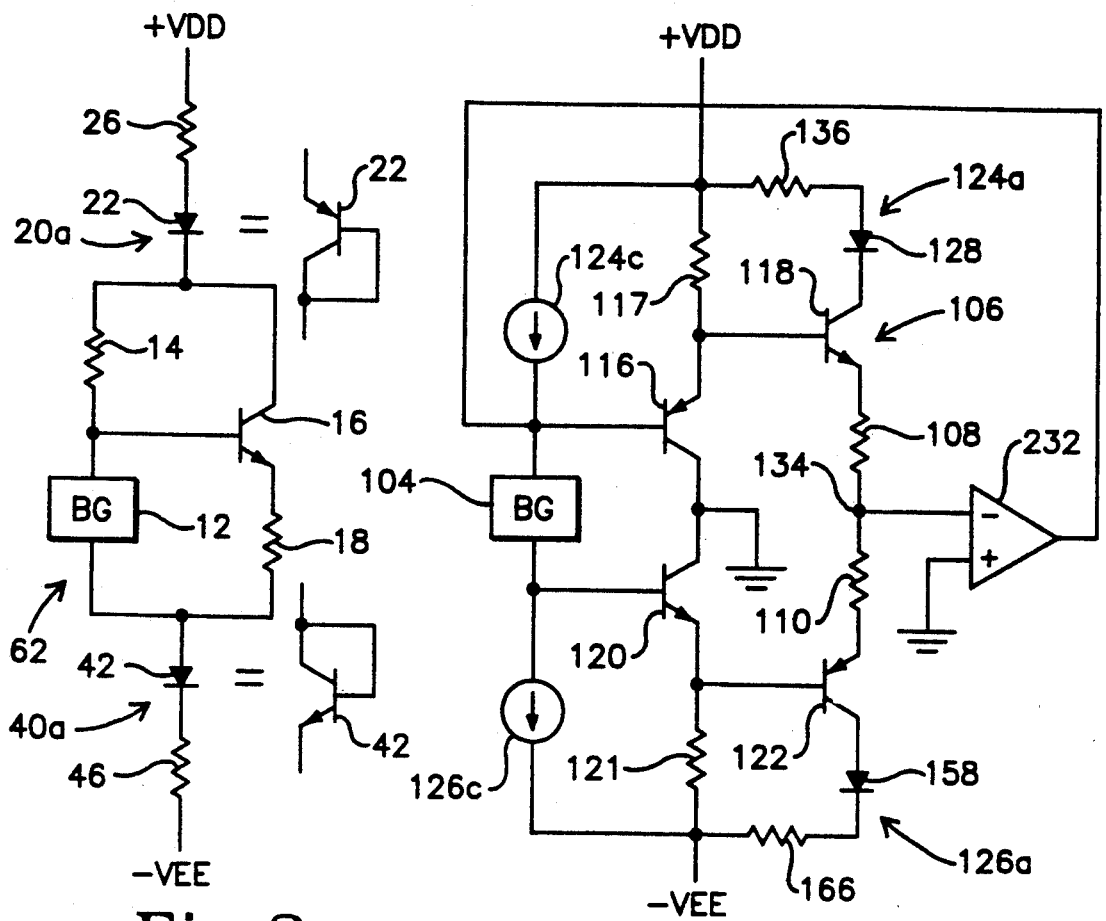
Fig. 2 (Prior Art)
Fig. 4
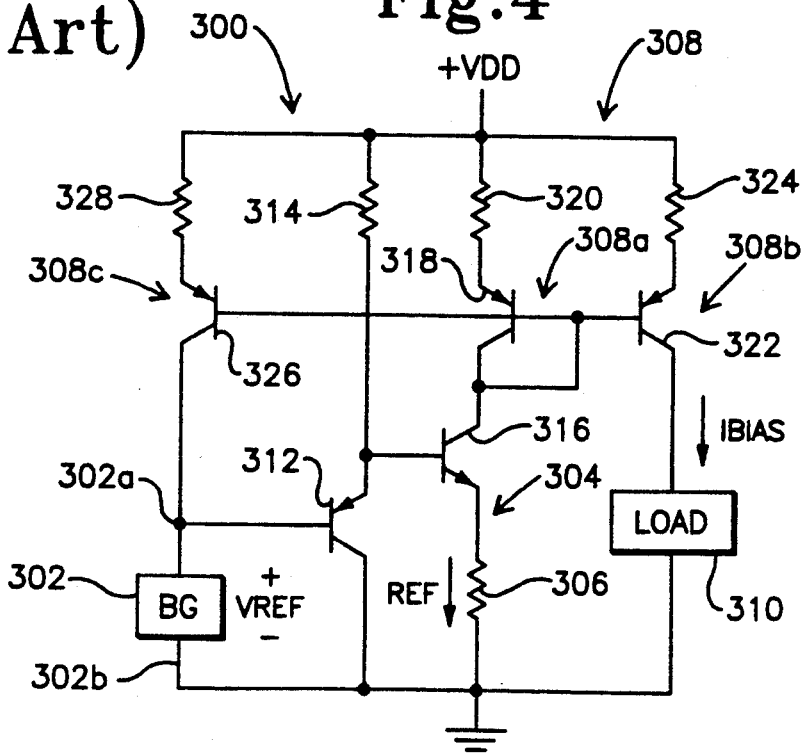
Fig. 5

SYMMETRICAL BIPOLAR BIAS CURRENT SOURCE WITH HIGH POWER SUPPLY REJECTION RATIO (PSRR)

This invention was made with Government support. The Government has certain rights in this invention.

BACKGROUND OF THE INVENTION

1. Field of the Invention

The present invention generally relates to the art of electronic signal processing using transistor circuits, and more specifically to a single-ended or symmetrical bipolar bias current source for a transistor amplifier or the like having a high power supply rejection ratio (PSRR) and stable startup operation.

2. Description of the Related Art

The specifications for state-of-the-art analog-to-digital converters (ADC) and other devices utilizing integrated circuit analog transistor amplifiers are becoming increasingly stringent. Amplifiers for extremely small signal and wide dynamic range applications require bias current supplies with correspondingly high PSRR and stable settling during startup.

An example of a device to which the present invention relates is disclosed in U.S. Pat. No. 4,970,470, entitled "DC-COUPLED TRANSIMPEDANCE AMPLIFIER", issued Nov. 13, 1990 to R. Gosser. The device is a current feedback amplifier having symmetrical bipolar (positive and negative) push-pull stages which require symmetrical bias currents. Although adequate for some applications, an amplifier such as disclosed by Gosser has a PSRR on the order of −60 db, which is unacceptably low to meet the advanced demands of future technology.

The symmetrical bipolar bias currents in Gosser's amplifier are provided by a master bias circuit 10 which is illustrated in present FIG. 1 and includes a bandgap reference source 12 which drops a highly stable reference voltage VREF thereacross. The source 12 has a positive terminal 12a which is connected through a resistor 14 to the collector of an NPN bipolar transistor 16, and a negative terminal 12b which is connected through a resistor 18 to the emitter of the transistor 16. The positive terminal 12a is also connected to the base of the transistor 16.

A positive current mirror 20 includes a PNP transistor 22 and an NPN transistor 24 which are connected in a Darlington compound transistor configuration, with the emitter of the transistor 24 being connected to the base of the transistor 22 and the collector of the transistor 24 being connected to the emitter of the transistor 22. The collector of the transistor 22 is connected to the collector of the transistor 16, whereas the emitter of the transistor 22 is connected through a resistor 26 to a positive voltage supply +VDD.

The collector of the transistor 22 is also connected to the base of a PNP transistor 28, the collector of which is connected to a negative voltage supply −VEE and the emitter of which is connected to the base of the transistor 24. The base of the transistor 24 is further connected to the supply +VDD through a resistor 30 and to the base of an NPN transistor 32. The voltage supplies +VDD and −VEE are equal and opposite relative to ground.

The transistor 32 is connected to a PNP transistor 34 in a Darlington configuration, with the emitter of the transistor 32 being connected to the base of the transistor 34 and the collector of the transistor 32 being connected to the emitter of the transistor 34. The emitter of the transistor 34 is connected to the source +VDD through a resistor 36, whereas the collector of the transistor 34 is connected to the positive end of a load 38 which symbolically represents the push-pull amplifier stages of Gosser's device.

A negative current mirror 40 includes a NPN transistor 42 and a PNP transistor 44 which are connected in a Darlington configuration, with the emitter of the transistor 44 being connected to the base of the transistor 42 and the collector of the transistor 44 being connected to the emitter of the transistor 42. The collector of the transistor 42 is connected to the negative terminal 12b of the source 12, whereas the emitter of the transistor 42 is connected through a resistor 46 to the supply −VEE.

The collector of the transistor 42 is also connected to the base of an NPN transistor 48, the collector of which is connected to the supply +VDD and the emitter of which is connected to the base of the transistor 44. The base of the transistor 44 is further connected to the supply −VEE through a resistor 50 and to the base of a PNP transistor 52.

The transistor 52 is connected to an NPN transistor 54 in a Darlington configuration, with the emitter of the transistor 52 being connected to the base of the transistor 54 and the collector of the transistor 52 being connected to the emitter of the transistor 54. The emitter of the transistor 54 is connected to the source −VEE through a resistor 56, whereas the collector of the transistor 54 is connected to the negative end of the load 38.

A resistor 58 is connected between the emitters of the transistors 24 and 44, whereas a resistor 60 is connected between the emitters of the transistors 32 and 52. The resistances of the resistors 58 and 60 are selected to be sufficiently high that the resistors 58 and 60 approximate constant current sources for the transistors 24,44 and 32,52.

The voltage at the base of the transistor 24 is one forward-biased diode drop Vbe above the voltage at the collector of the transistor 22 due to the base-emitter drop (equal to Vbe) across the transistor 28. The voltage at the emitter of the transistor 24 and thereby at the base of the transistor 22 is one diode drop below the voltage at the base of the transistor 24. These two diode drops cancel, such that the voltage at the base of the transistor 22 is equal to the voltage at the collector thereof.

The Darlington configuration of the transistors 22 and 24 cancels the base current modulation which is present in the transistor 22 in a known manner. The transistors 24 and 28 effectively connect the base and collector of the transistor 22 together such that the transistors 22, 24 and 28 in combination are electrically equivalent to a diode.

The voltage across the resistor 18 is equal to the reference voltage VREF minus the Vbe drop across the base-emitter junction of the transistor 16. This causes a reference current IREF to flow through the resistor 18 and, neglecting the base current of the transistor 16, into the collector and out of the emitter of the transistor 16.

The bandgap reference source 12, transistor 16 and resistors 14 and 18 constitute a reference current generator 62 which generates the reference current IREF with high precision and stability. Neglecting the base currents of the transistors 28 and 48, the reference current IREF flows from the positive supply +VDD through the resistor 26, transistors 22, 16 and 42 and resistor 46 to the negative supply −VEE.

The transistors 22, 24 and 28 and resistor 26 constitute an input section 20a of the current mirror 20. Due to the diode connection of the transistor 22, the base (and collector) voltage of the transistor 22 adjusts to a level which accommodates the current IREF flowing therethrough.

The transistors 32, 34 and 36 constitute an output section 20b of the current mirror 20. The base of the transistor 24 is connected to the base of the transistor 32, such that the base voltage of the transistor 34 is equal to the base voltage of the transistor 22. Assuming that the transistors 22, 24, 28, 32 and 34 and resistors 26 and 36 are matched, the current IBIAS=IREF will flow through the transistor 34 into the load 38. If these components are not matched, a current IBIAS will flow through the transistor 34 into the load 38 which corresponds to, but is different from, the reference current IREF.

The input section 20a of the current mirror 20 acts as a current source which sources the reference current IREF from the supply +VDD into the generator 62, with the current being regulated by the bandgap reference source 12. The input section 20a also mirrors the reference current IREF to the output section 20b which sources the reference current (or a corresponding current) from the supply +VDD into the load 38.

The operation of the current mirror 40 is symmetrical to that of the current mirror 20. The input section 40a sinks the current IREF from the generator 62 to the supply −VEE, and mirrors the current IREF to the output section 40b which sinks the current IREF (or a current corresponding to the current sourced by the output section 20b) from the load 38 to the supply −VEE.

Although only one output section 20b and 40b is illustrated for each of the current mirrors 20 and 40 respectively, the output sections 20b and 40b may be replicated to provide one or more additional output sections which are mirrored to the input sections 20a and 40a as indicated by broken lines 64 and 66 respectively.

The generator 62 and input sections 20a and 40a of the current mirrors 20 and 40 respectively are illustrated in FIG. 2. As discussed above, the bases of the transistors 22 and 42 are connected to the collectors thereof, are electrically equivalent to diodes, and are thusly represented in FIG. 2. The diode-connected transistors 22 and 42 have very low resistance, and the PSRR is primarily determined by the resistances of the resistors 26, 46, 14 and 18.

As disclosed by Gosser, the resistances of these resistors are low, with 26 and 46 being 400 Ω and 18 being 300 Ω. For this reason, a fluctuation in either of the voltage supplies +VDD and −VEE will modulate the collector-emitter voltage of the transistor 16 and cause a corresponding variation in IREF. This is because due to the very low resistances of the resistors 26, 46 and 18, the collector and emitter voltages of the transistor 16 follow the supply voltages +VDD and −VEE relatively closely, and the PSRR is thereby relatively low.

Another problem inherent in Gosser's bias circuit 10 is that the settling during startup is relatively unstable. The bandgap reference source 12 if; connected in series with the resistor 14 which has a relatively high value (10 KΩ), and is not controlled by any kind of feedback loop. The voltage at the upper or lower end of the source 12 is, in the worst case scenario, capable of latching to the supply VDD or −VEE respectively. This would render the circuit 10 inoperative until the situation was corrected.

SUMMARY OF THE INVENTION

In a symmetrical bipolar (dual polarity) bias current source embodying the present invention, a bandgap reference voltage source has positive and negative terminals which are connected through high impedance constant current sources to positive and negative voltage supplies respectively. The effect of variations of the voltage supplies on the voltage source is low due to the high impedances of the currents sources, providing a power supply rejection ratio (PSRR) which is substantially higher than that attainable by the prior art.

The reference voltage generated by the voltage source is converted into a reference current which flows through two equal series resistors, and also through current mirrors which produce positive and negative output currents corresponding thereto. The current sources for the voltage source are also controlled by the current mirrors.

A servo control amplifier senses the voltage at the junction of the resistors and adjusts the voltage at either the positive or negative terminal of the voltage source to maintain the voltages at the terminals symmetrical with respect to ground, thereby preventing the voltage source from latching to one of the voltage supplies during startup.

Although primarily intended for embodiment as a symmetrical bipolar bias source, the present invention can alternatively have a unipolar configuration which provides a single bias current. In this case, one end of the voltage source is tied to ground or other fixed reference, and the servo control function is not required.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 2 is a simplified schematic diagram illustrating a portion of the circuit of FIG. 1;

FIG. 4 is a simplified schematic diagram illustrating a portion of the bias source of FIGS. 3a and 3b; and FIG. 5 is a schematic diagram illustrating a unipolar bias source embodying the invention.

DETAILED DESCRIPTION OF THE INVENTION

Figure 3A:
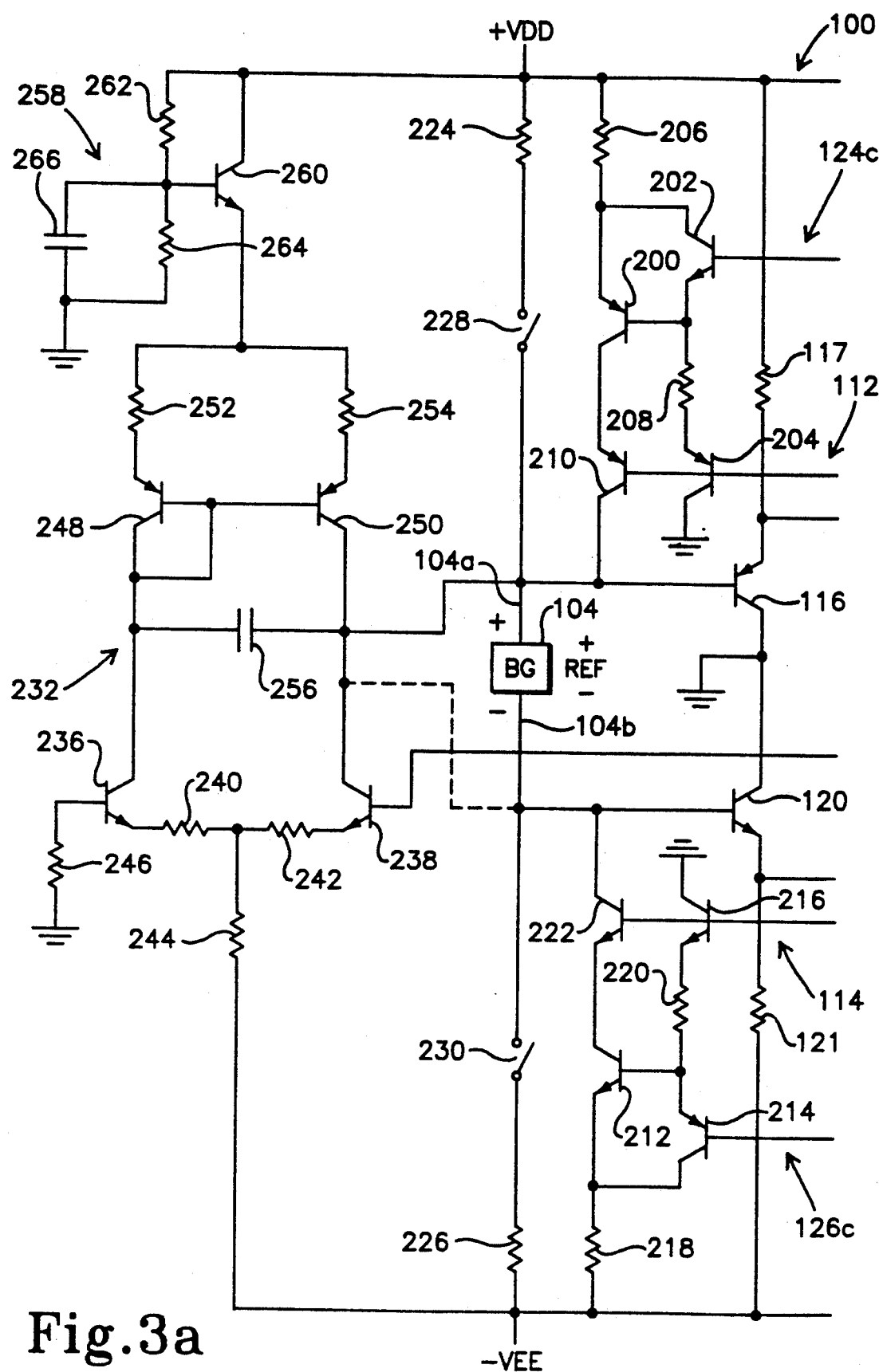
FIGS. 3a and 3b are electrical schematic diagrams illustrating the left and right portions respectively of a symmetrical bipolar bias circuit embodying the present invention.
Figure 3B:
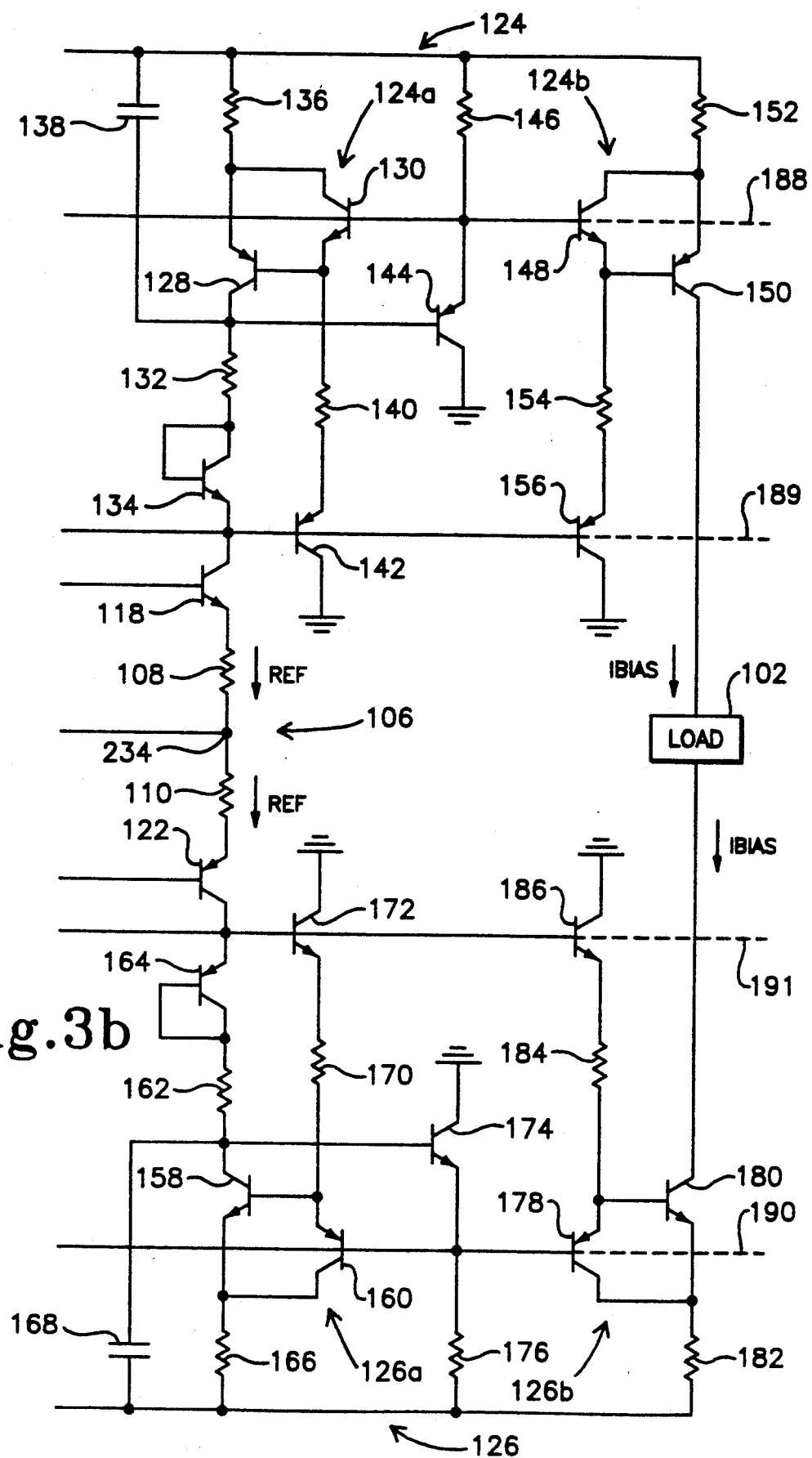

A symmetrical bipolar (dual polarity) bias current source 100 embodying the present invention is illustrated in FIGS. 3a and 3b. The source 100 sources a positive bias current IBIAS into the positive section and sinks the current IBIAS out of the negative section of a load 102, which is typically a symmetrical bipolar push-pull amplifier. The details of load 102 are not the subject matter of the present invention and will not be described in detail. An exemplary application for the present bias source would be a replacement for the master bias circuit in Gosser's transimpedance amplifier as described above, providing higher PSRR and improved startup operation.

The present source 100 includes a bandgap reference voltage source 104 having positive and negative terminals 104a and 104b respectively. The source 104 may be embodied by the National Semiconductor LM113 which provides a precision voltage drop VREF=1.23 V across the terminals 104a and 104b, although VREF is not limited to any particular value within the scope of the invention.

A voltage-to-current converter 106 is responsive to the reference voltage VREF and generates a corresponding reference current IREF which flows through two series connected resistors 108 and 110 which have equal resistances. The converter 106 further includes a positive transconductance amplifier 112 and a negative transconductance amplifier 114.

The amplifier 112 includes a PNP transistor 116 having a base connected to the terminal 104a, a collector connected to ground and an emitter connected to the base of an NPN transistor 118. The emitter of the transistor 116 is also connected to a positive voltage supply +VDD through a resistor 117. The emitter of the transistor 118 is connected to the upper end of the resistor 108.

The amplifier 114 includes an NPN transistor 120 having a base connected to the terminal 104b, a collector connected to ground and an emitter connected to the base of a PNP transistor 122. The emitter of the transistor 120 is also connected to a negative voltage supply −VEE through a resistor 121. The emitter of the transistor 122 is connected to the lower end of the resistor 110. The voltage supplies +VDD and −VEE are equal and opposite relative to ground.

The voltage across the resistors 108 and 110 is equal to VREF. This is because the transistors 116,118 and 120,122 are connected as emitter followers, and the Vbe drops across their base-emitter junctions cancel. The reference voltage VREF causes the reference current IREF to flow through the resistors 108 and 110 which is equal to IREF=VREF/(R108+R110), where R108 and R110 are the resistances (equal) of the resistors 108 and 110 respectively.

The bias source 100 further includes a positive current mirror 124 and a negative current mirror 126. The mirror 124 includes a PNP transistor 128 and an NPN transistor 130 which are connected in a Darlington compound transistor configuration, with the emitter of the transistor 130 being connected to the base of the transistor 128 and the collector of the transistor 130 being connected to the emitter of the transistor 128.

The collector of the transistor 128 is connected through a resistor 132 and diode-connected NPN transistor 134 to the collector of the transistor 118, whereas the emitter of the transistor 128 is connected through a resistor 136 to the supply +VDD. A capacitor 138 is connected between the collector of the transistor 128 and the supply +VDD. The emitter of the transistor 130 is also connected through a resistor 140 to the emitter of a PNP transistor 142, the collector of which is grounded and the base of which is connected to the collector of the transistor 118. The transistor 142 is part of and provides a constant bias current for the compound transistor which also includes the transistors 128 and 130.

The collector of the transistor 128 is also connected to the base of a PNP transistor 144, the collector of which is grounded and the emitter of which is connected to the base of the transistor 130. The base of the transistor 130 is further connected to the supply +VDD through a resistor 146 and to the base of an NPN transistor 148.

The transistor 148 is connected to a PNP transistor 150 in a Darlington configuration, with the emitter of the transistor 148 being connected to the base of the transistor 150 and the collector of the transistor 148 being connected to the emitter of the transistor 150. The emitter of the transistor 150 is connected to the source +VDD through a resistor 152, whereas the collector of the transistor 150 is connected to the positive end of the load 102.

The emitter of the transistor 148 is further connected through a resistor 154 to the emitter of a PNP transistor 156, the collector of which is grounded and the base of which is connected to the collector of the transistor 118. The transistor 156 is part of and provides a constant bias current for the compound transistor which also includes the transistors 148 and 150.

The negative current mirror 126 includes an NPN transistor 158 and a PNP transistor 160 which are connected in a Darlington configuration, with the emitter of the transistor 160 being connected to the base of the transistor 158 and the collector of the transistor 160 being connected to the emitter of the transistor 158.

The collector of the transistor 158 is connected through a resistor 162 and diode connected PNP transistor 164 to the collector of the transistor 122, whereas the emitter of the transistor 158 is connected through a resistor 166 to the supply −VEE. A capacitor 168 is connected between the collector of the transistor 158 and the supply −VEE. The emitter of the transistor 160 is also connected through a resistor 170 to the emitter of an NPN transistor 172, the collector of which is grounded and the base of which is connected to the collector of the transistor 122. The transistor 172 is part of and provides a constant bias current for the compound transistor which also includes the transistors 158 and 160.

The collector of the transistor 158 is also connected to the base of an NPN transistor 174, the collector of which is grounded and the emitter of which is connected to the base of the transistor 160. The base of the transistor 160 is further connected to the supply −VEE through a resistor 176 and to the base of a PNP transistor 178.

The transistor 178 is connected to an NPN transistor 180 in a Darlington configuration, with the emitter of the transistor 178 being connected to the base of the transistor 180 and the collector of the transistor 178 being connected to the emitter of the transistor 180. The emitter of the transistor 180 is connected to the source −VEE through a resistor 182, whereas the collector of the transistor 180 is connected to the negative end of the load 102.

The emitter of the transistor 178 is further connected through a resistor 184 to the emitter of an NPN transistor 186, the collector of which is grounded and the base of which is connected to the collector of the transistor 122. The transistor 186 is part of and provides a constant bias current for the compound transistor which also includes the transistors 178 and 180.

The transistors 142, 156, 172 and 186 act as constant current sources for the cascode connected transistors 130, 148, 160 and 178 respectively. The diode-connected transistors 134 and 164 provide temperature compensation for the transistors 130 and 160 respectively.

The voltage at the base of the transistor 130 is one diode drop Vbe above the voltage at the collector of the transistor 128 due to the base-emitter drop across the transistor 144. The voltage at the emitter of the transistor 130 and thereby at the base of the transistor 128 is one diode drop Vbe below the voltage at the base of the transistor 130. These two diode drops cancel, such that the voltage at the base of the transistor 128 is equal to the voltage at the collector thereof.

The Darlington configuration of the transistors 128 and 130 cancels the base current modulation which is present the transistor 128 in a known manner. The transistors 130 and 144 effectively connect the base and collector of the transistor 128 together such that the transistor 128 functions electrically as a diode.

Neglecting the base currents of the transistors 142 and 156, the reference current IREF flows from the positive supply +VDD through the resistor 136, transistor 128, resistor 132 and transistors 134 and 118 into the upper end of the resistor 108.

The transistors 128, 130, 134, 142 and 144 and resistors 132, 136, 140 and 146 constitute an input section 124a of the current mirror 124. Due to the diode connection of the transistor 128, the base (and collector) voltage of the transistor 128 adjusts to a level which accommodates the current IREF flowing therethrough.

The transistors 148, 150, 156 and resistors 152 and 154 constitute a first output section 124b of the current mirror 124. The base of the transistor 130 is connected to the base of the transistor 148, such that the base voltage of the transistor 150 is equal to the base voltage of the transistor 128. Assuming that the transistors 128, 130, 142, 148, 150 and 156 and resistors 136, 140, 152 and 154 are matched, the current IBIAS=IREF will flow through the transistor 150 into the load 102. If these components are not matched, a current IBIAS will flow through the transistor 150 into the load 102 which corresponds to, but is different from, the reference current IREF.

In summary, the input section 124a of the current mirror 124 mirrors the reference current IREF to the first output section 124b which sources the output current IBIAS which may or may not be equal to IREF from the supply +VDD into the load 102.

The operation of the current mirror 126 is symmetrical to that of the current mirror 124. The input section 126a mirrors the current IREF to a first output section 126b which sinks the current IBIAS from the load 102 to the supply −VEE.

Although only one output section 124b and 126b is illustrated for each of the current mirrors 124 and 126 respectively, the output sections 124b and 126b may be replicated to provide one or more additional output sections which are mirrored to the input sections 124a and 126a as indicated by broken lines 188,189 and 190,191 respectively.

The current mirrors 124 and 126 further include second output sections 124c and 126c respectively which function as positive and negative current sources for the bandgap reference voltage source 104.

The output section 124c includes transistors 200, 202 and 204 and resistors 206 and 208 which replicate the transistors 148, 150 and 156 and resistors 152 and 154 of the first output section 124b. The second output section 124c further includes a PNP transistor 210 having an emitter connected to the collector of the transistor 200, a collector connected to the positive terminal 104a of the source 104 and a base connected to the collector of the transistor 118. The transistor 210 constitutes a cascode stage to increase the impedance between the source +VDD and the terminal 104a.

The output section 126c includes transistors 212, 214 and 216 and resistors 218 and 220 which replicate the transistors 178, 180 and 186 and resistors 182 and 184 of the first output section 126b respectively. The second output section 126c further includes an NPN transistor 222 having an emitter connected to the collector of the transistor 212, a collector connected to the negative A terminal 104b of the source 104 arid a base connected to the collector of the transistor 122. The transistor 222 constitutes a cascode stage to increase the impedance between the source −VEE and the terminal 104b.

The second output section 124c is mirrored to the input section 124a of the current mirror 124 and sources the reference current IREF (or a current corresponding thereto) from the voltage supply +VDD into the terminal 104a of the source 104. The second output section 126c is mirrored to the input section 126a of the current mirror 126 and sinks a current which is equal to the current sourced by the output section 124c from the terminal 104b of the source 104 to the voltage supply −VEE.

The manner in which the present invention provides a higher PSRR than the prior art bias circuit 10 described above will become clear from a comparison of FIGS. 2 and 4. In FIG. 4, the transistors 128 and 158 of the input sections 124a and 126a of the current mirrors 124 and 126 respectively are illustrated as diodes, whereas the second output sections 124c and 126c are illustrated as current sources.

As described above with reference to FIG. 2, the diode-connected transistors 128 and 158 are electrically equivalent to diodes, and have very low impedance. However, this does not affect the PSRR of the bias circuit 100, since the transistors 128 and 158 are isolated from the voltage source 104 by the generator 106.

The second output sections 124c and 126c of the current mirrors 124 and 126 respectively, which act as current sources for the voltage source 104, do not include diode-connected transistors, and have very high impedance. The sections 124c and 126c therefore provide high isolation of the voltage source 104 from the supplies +VDD and −VEE, such that source 104 electrically floats. Due to this isolation, fluctuation of the voltage supplies +VDD and −VEE has negligible effect on the reference current IREF, and the PSRR of the present bias current source 100 is very high compared to the prior art.

Figure 1:
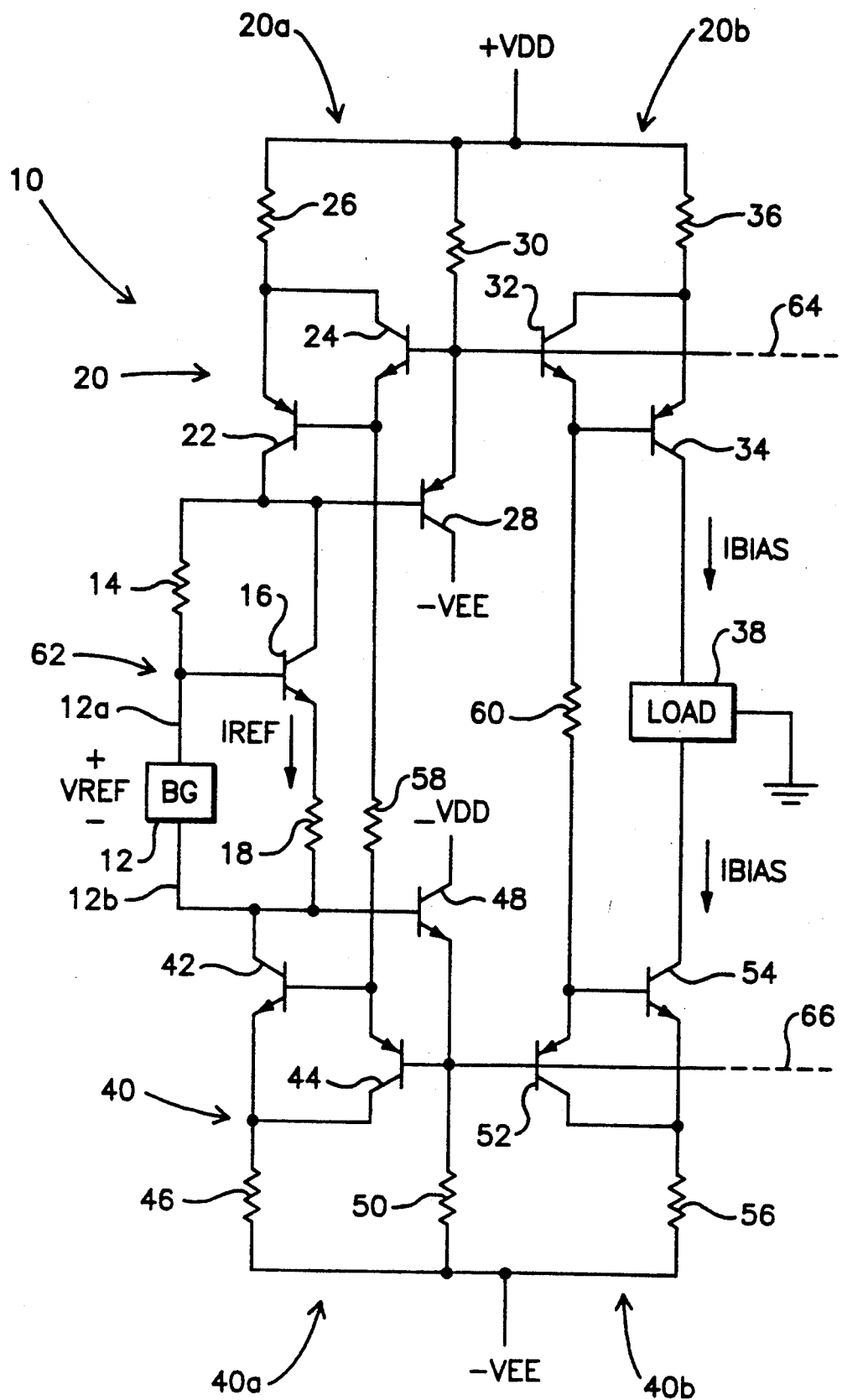
FIG. 1 is an electrical schematic diagram illustrating a prior art bipolar bias circuit for a transimpedance amplifier.

Assuming that the voltage source 104 is embodied by the National LM113 which has a resistance of approximately 0.3Ω, and the impedances of the second output sections 124c and 126c are each 1 MΩ, the theoretical PSRR of the source 100, neglecting the resistance of the source 104, is PSRR =20 log [0.3Ω/(2 MΩ)]=−136.5 db. This compares to −60 db for the prior art bias circuit 10 illustrated in FIG. 1.

Startup of the bias source 100 requires the generation of the reference current IREF which is fed back via the current mirrors 124 and 126 to provide operating current for the bandgap reference voltage source 104. However, generation of the reference current IREF requires the voltage source 104 to generate the reference voltage VREF, which it cannot do if it does not receive operating current. For this reason, it might not be possible to start up the bias source 100 as described thus far.

In order to ensure that the voltage source 104 will receive immediate operating current upon application of the voltage supplies +VDD and −VEE to the source 100, resistors 224 and 226 are connected in parallel with the second output sections 124c and 126c of the current mirrors 124 and 126 respectively. The resistors 224 and 226 have resistance values which are as large as possible (to minimize the PSRR) and still enable sufficient trickle current to flow therethrough to provide operating power for the source 104 so that it can generate the reference voltage VREF and the generator 106 can generate the reference current IREF.

It is desirable to disconnect the resistors 224 and 226 from the source 104 after startup since they reduce the PSRR. Assuming that the resistors 224 and 226 each have a resistance of 100 KΩ and neglecting the resistance of the source 104, the resistance R between the voltage source 104 and each of the supplies +VDD and −VEE is R=[(100 KΩ X 1 MΩ)/(100 KΩ+1 MΩ)]=90.9 KΩ, and the PSRR is reduced to approximately PSRR=20 log [0.3Ω/(2 X 90.9 KΩ)]=−115.6 db.

For this reason, switches 228 and 230 are preferably provided in series with the resistors 224 and 226 respectively to disconnect them from the voltage source 104 after the reference current IREF has been stably generated. Although not illustrated explicitly, the switches 228 and 230 may be embodied by switching transistors. The switches 228 and 230 are initially closed, and then opened by a timer or the like (not shown) after sufficient time has elapsed for the bias source 100 to be stably started up.

As described above, the high impedance output sections 124c and 126c of the current mirrors 124 and 126 which act as constant current sources for supplying operating current to the voltage source 104 electrically isolate the source 104 from the supplies +VDD and −VEE respectively. Since the source 104 electrically floats, it is possible for the upper or lower end of the source 104 to float toward the supply +VDD or −VEE and latch at the respective supply voltage, rendering the bias current source 100 inoperative until the situation is corrected.

In order to prevent this from occurring, the source 100 further includes a servo control amplifier 232 for clamping a junction 234 between the resistors 108 and 110 to ground and thereby maintaining the voltages at the terminals 104a and 104b of the source 104 equal and opposite relative to ground. The amplifier 232 is illustrated symbolically in FIG. 4, and the detailed circuit configuration thereof is illustrated in FIG. 3a.

The amplifier 232 is essentially a differential-to-single-ended converter, and includes NPN transistors 236 and 238 having emitters which are interconnected by resistors 240 and 242 respectively. The junction of the resistors 240 and 242 is connected through a resistor 244 to the source −VEE. The base of the transistor 236 is connected to ground through a resistor 246, whereas the base of the transistor 238 is connected to the junction 234. The base of the transistor 236 constitutes a non-inverting input of the amplifier 232, whereas the base of the transistor 238 constitutes an inverting input thereof.

The collectors of the transistors 236 and 238 are connected to the collectors of PNP transistors 248 and 250, the emitters of which are interconnected by resistors 252 and 254 respectively. A capacitor 256 is connected across the collectors of the transistors 248 and 250. The base and collector of the transistor 248 are interconnected in a diode configuration. The transistors 248 and 250 constitute a current mirror, with the current through the transistor 248 being mirrored to the transistor 250.

The junction of the resistors 252 and 254 is connected through a level shifting circuit 258 to the supply +VDD. The circuit 258 includes an NPN transistor 260 having an emitter connected to the junction of the resistors 252 and 254 and a collector connected to the supply +VDD. A voltage divider for biasing the base of the transistor 260 includes a resistor 262 connected between the base of the transistor 260 and the source +VDD, and a resistor 264 connected between the base of the transistor 260 and ground. A capacitor 266 is connected in parallel with the resistor 264.

The collector of the transistor 238, which constitutes the output of the amplifier 232, can be connected to the terminal 104a of the voltage source 104 as illustrated in solid line, or to the terminal 104b thereof as illustrated in broken line. The operation of the amplifier 232 will produce the same result in either case.

The amplifier 232 compares the voltage at the junction of the resistors 108 and 110 which appears at its inverting input to ground which appears at its non-inverting input. The voltage across the resistors 108 and 110 in series will not vary from VREF. However, since the voltage source 104 electrically floats due to the high impedance of its current sources, the voltages at the ends of the resistors 108 and 110 and corresponding the voltages at the terminals 104a and 104b can drift together relative to ground in a common mode manner.

The voltage at the junction 234 is equal to the voltage at the upper end of the resistor 108 and at the lower end of the resistor 110 level shifted up and down by VREF/2 respectively. If these voltages are equal and opposite relative to ground, the voltage at the junction 234 will be zero and the output of the amplifier 232 will be zero. Assuming that the voltages drift upwardly (go more positive), the voltage at the junction 234 and at the inverting input (base of the transistor 238) of the amplifier 232 will increase by the same amount. The transistor 238 will conduct more current than the transistor 240, and the voltage at the output (collector of the transistor 238) of the amplifier 232 will decrease (go negative).

The negative output voltage of the amplifier 232 will cause the voltage at the terminal 104a or 104b to which it is connected to decrease. The voltages at the terminals 104a and 104b move together due to the fixed voltage drop VREF across the voltage source 104. This operation causes the voltages at the terminals 104a and 104b to move downwardly (more negative) until they are equal and opposite relative to ground and the voltage at the junction 234 is equal to ground.

The operation of the amplifier 232 is opposite to that described above when the voltages at the terminals 104a 104b and at the junction 234 drift downwardly (go more negative).

Although primarily intended for embodiment as a symmetrical bipolar bias source, the present invention can alternatively have a unipolar configuration which provides a single bias current. A unipolar bias source according to the invention generally consists of the upper half of the bias current source 100 for producing a positive bias current, or the lower half of the source 100 for producing a negative bias current. In this case, one end of the bandgap reference voltage source is tied to ground or other fixed reference, and the servo control function is not required. In the unipolar configuration, the PSRR is reduced by 6 db from that of the bipolar configuration, or PSRR=20 log [0.3Ω/(1 MΩ)]=−130.5 db.

FIG. 5 illustrates a unipolar bias current source 300 embodying the present invention which includes a bandgap reference voltage source 302 which produces a voltage drop VREF thereacross. A voltage-to-current converter 304 in the form of a transconductance amplifier is responsive to the reference voltage VREF and causes a reference current IREF corresponding thereto to flow through a resistor 306. The reference current IREF flows through an input section 308a of a current mirror 308, and is mirrored to a first output section 308b which sources a corresponding current IBIAS into a load 310 and to a second output section 308c which sources an operating current for the source 302.

The source 302 has a negative terminal 302b which is connected to ground and a positive terminal 302a which is connected to the base of a PNP transistor 312 of the converter 304. The collector of the transistor 312 is connected to ground, whereas the emitter of the transistor 312 is connected to a voltage supply +VDD through a resistor 314. The emitter of the transistor 312 is also connected to the base of a transistor 316, the emitter of which is connected to ground through the resistor 306.

The input section 308a of the current mirror 308 includes a diode-connected PNP transistor 318 having a collector connected to the collector of the transistor 316 and an emitter connected to the supply +VDD through a resistor 320. The first output 308b section of the current mirror 308 includes a PNP transistor 322 having a base connected to the base of the transistor 318, an emitter connected through a resistor 324 to the supply +VDD and a collector connected to the load 310. The second output section 308c of the current mirror 308 includes a PNP transistor 326 having a base connected to the base of the transistor 318, an emitter connected to the supply +VDD through a resistor 328 and a collector connected to the terminal 302a of the source 302.

The operation of the bias current source 300 is essentially similar to that of the upper half of the bias current source 100 illustrated in FIGS. 3a and 3b. The current mirror 308 is illustrated in its most basic form in FIG. 5. However, the scope of the invention includes replacing the transistors 318, 322 and 326 with Darlington type compound transistors as in the current mirrors of the source 100 to provide improved performance. It is also within the scope of the invention to replace the current mirrors in the source 100 with simple current mirrors as illustrated in FIG. 5, Wilson current mirrors, or any other suitable type of current mirrors.

While several illustrative embodiments of the invention have been shown and described, numerous variations and alternate embodiments will occur to those skilled in the art, without departing from the spirit and scope of the invention.

For example, although the invention has been described and illustrated as including complementary bipolar transistors, it is within the scope of the invention to configure a bias current source using complementary-metal-oxide-semiconductor (CMOS) or any other type of suitable transistors.

Accordingly, it is intended that the present invention not be limited solely to the specifically described illustrative embodiments. Various modifications are contemplated and can be made without departing from the spirit and scope of the invention as defined by the appended claims.

We claim:

1. A symmetrical bipolar bias current source, comprising:

positive and negative voltage supply nodes, reference voltage source means having a positive terminal and a negative terminal and producing a predetermined reference voltage thereacross;

high impedance positive current source means having an impedance of at least about 10 kohms for sourcing a positive supply current from said positive voltage supply node into said positive terminal of the voltage source means;

high impedance negative current source means having an impedance of at least about 10 kohms for sinking a negative supply current which is substantially equal to said positive supply current out of said negative terminal of the voltage source means to said negative voltage supply node;

voltage-to-current converter means responsive to said reference voltage for generating a corresponding reference current that is substantially independent of fluctuations in the voltages at said positive and negative voltage supply nodes;

positive current mirror means responsive to said reference current for sourcing a positive output current corresponding thereto; and negative current mirror means responsive to said reference current for sinking a negative output current which is substantially equal to said positive output current.

2. A bias current source as in claim 1, in which:

the positive current mirror means comprises a positive input section through which said reference current flows and a first positive output section which is mirrored to said positive input section and sources said positive output current;

the positive current source means constitutes a second positive output section of the positive current mirror means which is mirrored to said positive input section and sources said positive supply current;

the negative current mirror means comprises a negative input section through which said reference current flows and a first negative output section which is mirrored to said negative input section and sources said negative output current; and the negative current source means constitutes a second negative output section of the negative current mirror means which is mirrored to said negative input section and sources said negative supply current.

3. A bias current source as in claim 1, further comprising:

first resistance means connected in parallel with the positive current source means for enabling a positive trickle current to flow from said positive voltage supply into said positive terminal of the voltage source means; and second resistance means connected in parallel with the negative current source means for enabling a negative trickle current to flow from said negative terminal of the voltage source means into said negative voltage supply.

4. A bias current source as in claim 3, further comprising switch means for selectively disconnecting the first and second resistance means from said positive and negative terminals of the voltage source means respectively.

5. A bias current source as in claim 1, further comprising servo control means for maintaining the voltages at said positive and negative terminals of the voltage source means equal and opposite relative to ground.

6. A symmetrical bipolar bias current source, comprising:
reference voltage source means having a positive terminal and a negative terminal and producing a predetermined reference voltage thereacross;
high impedance positive current source means for sourcing a positive supply current from a positive voltage supply into said positive terminal of the voltage source means;
high impedance negative current source means for sinking a negative supply current which is substantially equal to said positive supply current out of said negative terminal of the voltage source means to a negative voltage supply;
voltage-to-current converter means responsive to said reference voltage for generating a reference current corresponding thereto;
positive current mirror means responsive to said reference current for sourcing a positive output current corresponding thereto, said positive current mirror means comprising a positive input section through which said reference current flows and a positive output section which is mirrored to said positive input section and sources said positive output current; and
negative current mirror means responsive to said reference current for sinking a negative output current which is substantially equal to said positive output current, said negative current mirror means comprising a negative input section through which said reference current flows and a negative output section which is mirrored to said negative input section and sources said negative output current;
said converter means comprising:
resistance means having first and second opposite ends;
a positive transconductance amplifier having a positive voltage input connected to said positive terminal of the voltage source means and a positive current output for sinking said reference current out of said positive input section of the positive current mirror means and sourcing said reference current into said first end of the resistance means; and
a negative transconductance amplifier having a negative voltage input connected to said negative terminal of the voltage source means and a negative current output for sinking said reference current out of said second end of the resistance means and sourcing said reference current into said input section of the negative current mirror means.

7. A bias current source as in claim 6, further comprising servo control means for maintaining the voltages at said positive and negative terminals of the voltage source means equal and opposite relative to ground.

8. A bias current source as in claim 7, in which:
said resistance means comprises first and second equal resistors which are connected in series with each other and define a junction therebetween; and
the servo control means comprises a differential amplifier having a non-inverting input connected to ground, an inverting input connected to said junction and an output connected to one of said positive and negative terminals of the voltage source means.

9. A bias current source as in claim 1, in which the voltage source means comprises a bandgap reference voltage source.

10. A bias current source, comprising:
positive and negative voltage supply nodes,
reference voltage source means for producing a predetermined reference voltage;
high impedance current source means having an impedance of at least about 10 kohms and connected in circuit with said positive and negative supply voltage nodes for causing a supply current to flow through the voltage source means;
voltage-to-current converter means responsive to said reference voltage for generating a corresponding reference current that is substantially independent of fluctuations in the voltages at said positive and negative voltage supply nodes; and
current mirror means responsive to said reference current for producing an output current corresponding thereto.

11. A bias current source as in claim 10, in which:
the current mirror means comprises an input section through which said reference current flows and a first output section which is mirrored to said input section and produces said output current; and
the current source means constitutes a second positive output section of the current mirror means which is mirrored to said input section and produces said supply current.

12. A bias current source as in claim 10, further comprising:
resistance means connected in parallel with the current source means for enabling a positive trickle current to flow from said voltage supply into the voltage source means.

13. A bias current source as in claim 12, further comprising switch means for selectively disconnecting the resistance means from the voltage source means.

14. A bias current source as in claim 10, in which the voltage source means comprises a bandgap reference voltage source.

* * * * *